United States Patent [19]
Gore

[11] Patent Number: 5,573,172
[45] Date of Patent: Nov. 12, 1996

[54] SURFACE MOUNT STRESS RELIEF HIDDEN LEAD PACKAGE DEVICE AND METHOD

[75] Inventor: John G. Gore, Sorrento, Fla.

[73] Assignee: Sawtek, Inc., Orlando, Fla.

[21] Appl. No.: 346,131

[22] Filed: Nov. 29, 1994

Related U.S. Application Data

[63] Continuation-in-part of Ser. No. 148,292, Nov. 8, 1993, Pat. No. 5,369,551.

[51] Int. Cl.⁶ ........................................ H05K 3/34
[52] U.S. Cl. .................. 228/180.22; 228/103; 228/175
[58] Field of Search ............................ 228/103, 175, 228/189, 180.22; 29/840; 174/52.4, 261

[56] References Cited

U.S. PATENT DOCUMENTS

| | | | |
|---|---|---|---|
| 3,588,616 | 6/1971 | Palazzini | 361/783 |
| 3,762,040 | 10/1973 | Burns et al. | 29/593 |
| 4,184,043 | 1/1980 | Hildering | 174/260 |
| 4,357,647 | 11/1982 | Hadersbeck et al. | 361/782 |
| 4,402,450 | 9/1983 | Abraham et al. | 228/180.22 |
| 4,554,575 | 11/1985 | Lucas | 174/252 |
| 4,641,222 | 2/1987 | Derfiny et al. | 361/768 |
| 4,642,889 | 2/1987 | Grabbe | 29/84 |
| 4,654,248 | 3/1987 | Mohammed | 428/137 |
| 4,658,332 | 4/1987 | Baker et al. | 361/751 |
| 4,847,136 | 7/1989 | Lo | 428/195 |
| 4,895,524 | 1/1990 | Thepault | 439/74 |
| 5,155,905 | 10/1992 | Miller, Jr. | 29/843 |
| 5,177,326 | 1/1993 | Goldhammer | 174/52.4 |
| 5,352,851 | 10/1994 | Wallace et al. | 174/52.4 |
| 5,477,933 | 12/1995 | Nguyen | 228/180.22 |

OTHER PUBLICATIONS

*Surface–Mount Substrates: The Key In Going Leadless*, Howard W. Markstein, Electronic Production, Mar. 1984, pp. 23–30, 53.

*Assembly Design And Reliability*, Stephen W. Hinch, 1988 Handbook of Surface Mount Technology, Chap. 6, pp. 153–175.

*SMT Design For Manufacturability*, Phil P. Marcoux, 1989, PPM Associates Seminar Manual, pp. 67–74.

*Low–Cost Surface Mount Packaging For Saws*, J. Gore, B. Horine, J. Phillips, R. Hoffman and J. Dodge, Oct. 1992, 1992 Ultrasonic Symposium Proceedings, vol. 1 of 2, pp. 129–138.

*Design and Manufacture of High Reliability Surface Mount Assemblies for Aerospace Applications*, Gregory L. Horton and Daniel B. Elder, Undated, Internal Report for Sperry Corporation, Aerospace & Marine Group, Commercial Flight Sysems Division, pp. 288–305.

*Primary Examiner*—Samuel M. Heinrich
*Attorney, Agent, or Firm*—Allen, Dyer, Doppelt, Franjola & Milbrath, P.A.

[57] ABSTRACT

A hidden lead package device is configured to be placed between a leadless component such as a surface mount package (SMP) used to house a SAW device and a standard printed circuit board configured for solder joints in a leadless contact with the printed circuit board. The hidden lead device is made using materials having similar characteristic thermal expansion properties as that of the SMP and printed circuit board pads to which the hidden lead is affixed. The hidden lead extends across the underside of the SMP along the PCB surface. One end of the lead is brazed to an SMP pad and the opposite end is soldered to a communicating PCB pad. The brazing temperature is higher than the reflow temperature for the solder. The hidden lead device causes the relative movement between the leadless carrier and the printed circuit board to occur along a length of the hidden lead and thus minimizes tensional or compressive forces to the solder joints. Such an approach relieves the stress and resulting creep typically seen at solder joints when mounting leadless packages to printed circuit boards. In addition, by segregating the input and output pads and placing the hidden leads to ground pads between those of input and output pads, crosstalk rejection of the components is improved.

20 Claims, 6 Drawing Sheets

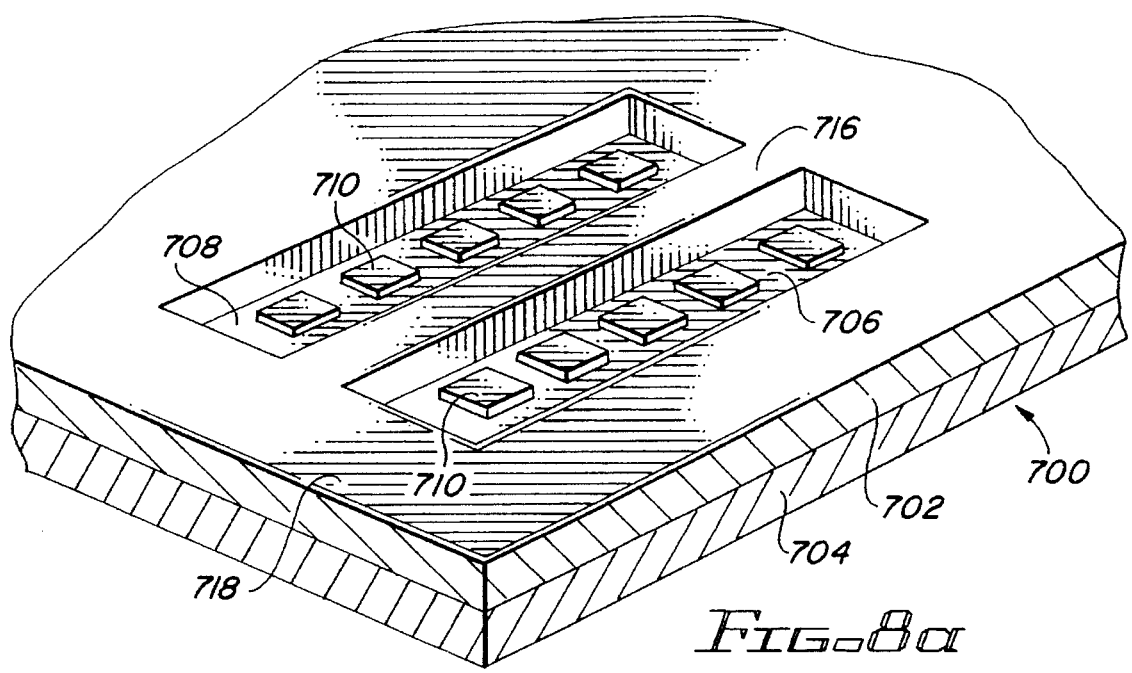
FIG_8a
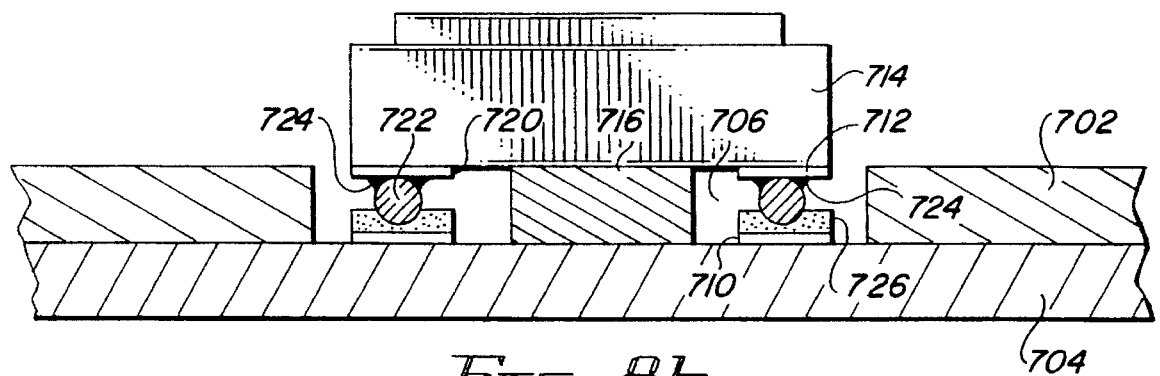
FIG_8b
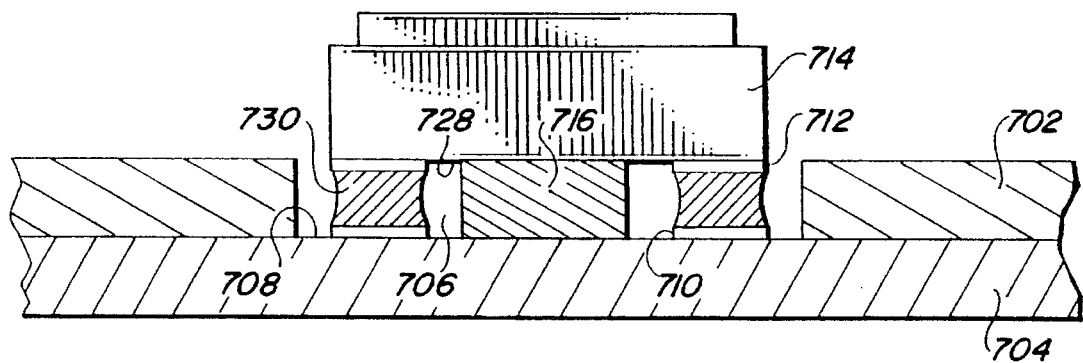
FIG_8c

SURFACE MOUNT STRESS RELIEF HIDDEN LEAD PACKAGE DEVICE AND METHOD

CROSS-REFERENCE TO RELATED APPLICATIONS

This application is a continuation-in-part of application Ser. No. 08/148,292, filed Nov. 8, 1993 for Surface Mount Stress Relief Interface System and Method issuing on November 29, 1994 as U.S. Pat. No. 5,369,551.

FIELD OF THE INVENTION

This invention relates to surface mount technology using leadless integrated electronic circuit components and in particular to systems and methods for minimizing stress between the leadless component such as a surface mount package and the printed circuit board.

DESCRIPTION OF THE BACKGROUND ART

Surface mount technology offers several advantages for electronic equipment manufacturers including the critical advantage of increased component packing density. One of the biggest demands for surface mount technology in the surface acoustic wave (SAW) device industry comes from the cellular and cordless telephone market. The "cigarette pack" is being replaced by the "telephone pack". For the electronic equipment manufacturer, surface mount technology carries with it a difficult solder joint thermal mismatch problem between the component or surface mount package and the PC board. The thermal mismatch problems are especially acute for low frequency and narrow bandwidth SAW devices where the package size can be relatively large. These problems often rule out off-the-shelf options and therefore confront the SAW manufacturer with high package tooling costs.

The coefficient of thermal expansion (CTE) is a number that represents the dimensional change of a material over a specific temperature range. By way of example, a well accepted mounting arrangement for mounting a surface mount package (SMP) which is carrying a SAW device is to solder the ceramic bases onto a copper clad PC board material using a lead and tin alloy solder paste. The thermal profile during solder paste reflow typically exceeds 200° C. for short periods of time. The CTE of the epoxy and glass PC board material is approximately three times greater than the ceramic material used in the package and occasionally less than half the CTE of the solder alloy that joins the two. Effects of the thermal mismatch are first encountered during the cool down period after the solder is reflowed during initial attachment. The molten solder will solidify just below 200° C. and at that time the assembly is mechanically fixed and as near stress free as possible. As the temperature continues to decrease, the differing expansion rates begin to become a factor. The PC board material decreases in size at a ratio of about three to one with respect to the SMP ceramic substrate. The solder alloy decreases by as much as two to one relative to the PC board and six to one relative to the ceramic. As the relative locational association of the solder pads on the ceramic and PC board begins to change, mechanical stress increases in all three components ( the ceramic, the PC board, and the solder joint). The solder joint is usually the weakest of the three and as a result breakage occurs in the joints at various stress points depending on the specific alloy being used.

One factor that complicates the identification of over stressed joints is that the joints are most likely to degrade but not completely fail. In other words, they may remain electrically active for some period of time and then experience failure. While the first cool down period after reflow begins the process of mechanically degrading the solder joint, the joints are most likely to fail after some number of thermal cycles during the normal life environment. Another situation includes the intermittent electrical failure of the solder joint. The indication is that a particular joint functions normally and displays no problems except for this intermittent open indication that may exist for very short periods during some portion of the thermal cycle. The relative movement created by the CTE mismatch is sufficient to move a break in the solder joint into and out of electrical contact. Such failures are difficult to detect and require more extensive testing including greater attention to the temperature cycles used and continuous monitoring during the cycles.

As discussed, more and more demands are being made for providing compact instruments such as the cellular telephone that fits in the breast pocket. Leadless packages are therefore very desirable for meeting the size efficiency demands. Leaded components (as in electrical lead) relieve the stress problems but take up valuable "real estate" in doing so. Leadless chip carriers offer attractive size efficiency but suffer thermal mismatch and crosstalk problems. Several options are available to the industry that meet many of the requirements. Packages are supplied with either flat leads or simple terminations. Leads may exit from the sides of the package and transition to the board level as in "gull-winged" and "J-lead" designs. Alternatively, they may exit from the bottom and either be flat or tuck underneath the package as in the "C-lead" configuration. The gull-wing or flat approaches are simple but waste precious PC board area. The J-lead and C-lead raise the base further off the PC board than alternative techniques, resulting in not only increased volume requirements for a device but higher crosstalk and lead inductance.

It is also well known in the art to increase the height of the solder column between the package terminal pad and PC board terminal pad. Increasing the height of a column with a fixed SMP footprint spreads the total stress over a greater mass and ultimately decreases the stress per unit mass. The column deals with the relative pad movement by bending as opposed to shearing. Since the stress levels per unit mass can be maintained at a level that does not cause creep to occur, the joint will survive thermal cycles. Although this approach is simple in concept, there are problems in the implementation of such a mounting scheme. Foremost is the difficulty in increasing solder column height for a given footprint using standard production assembly techniques. By way of example, many factors must be considered including the solder alloy used, special tooling and fixturing to elevate the SMP during reflow, and cleaning and inspection problems that result from the use of non-removable spacers between the part and the PC board.

U.S. Pat. No. 4,847,136 issued to Ching-Ping Lo on Jul. 11, 1993 discloses a thermal expansion mismatch forgivable printed wiring board for a ceramic leadless chip carrier. A PC board is fabricated wherein a thin expansion layer is provided on top of what would be considered a conventional PC board. This expansion layer is bonded to the PC board except at locations underneath the footprint of the chip carrier and solder joints. This expansion layer reduces the stress of the solder joints between the ceramic leadless chip carrier and the PC board due to thermal expansion mismatch, thus reducing the cracking of the solder joint. As is well known in the art, metal plates are added as part of the PC board where it is desirable to thermally conduct heat away from the PC board and where added strength is required. U.S. Pat. No. 4,658,332 issued to Thomas E. Baker et al. on Apr. 14, 1987 teaches a compliant layer PC board.

U.S. Pat. No. 4,641,222 issued to Dennis J. Derfiny et al. on Feb. 3, 1987 discloses a mounting system for stress relief in surface mounted components. The PC board is conditioned by removing selected areas of media surrounding the points of attachment between the surface mounted component and the PC media. In addition, a spacing element is disposed between the surface mounted component and the PC board to promote the formation of a virtual lead during assembly. U.S. Pat. No. 4,654,248 issued to Juzer Mohammed on Mar. 31, 1987 teaches a PC board with zones of controlled thermal coefficient of expansion.

U.S. Pat. No. 4,554,575 issued to Michael R. Lucas on Nov. 19, 1985 teaches a low stress leadless chip carrier and method for assembly to a PC board. A plurality of castellations are provided in the perimeter walls of the carrier member and solder preforms are deformably fitted in the castellations for reflow vapor phase soldering to a PC board. A spacer member is disposed between the carrier member and the printed circuit board and has a CTE matched to that of the solder. The spacer includes a high thermal conductivity planar metal portion sandwiched between an adhesive epoxy layer which facilitates assembly of the carrier to the PC board.

While there has been an effort to solve solder joint stress failures caused by thermal mismatch, the need to provide an effective packaging method that meets the needs for simple fabrication having reduced joint failure due to thermal stress problems and reduced crosstalk has not been provided.

SUMMARY OF INVENTION

The present invention discloses a hidden lead package devise and method useful with leadless electrical connections of components having different coefficients of thermal expansion. A leadless electronic package mounting device comprises a lead having a first end, a second end opposing the first lead end, and a central portion therebetween. The central portion has a length sufficient for generally extending the lead across an underside of an electronic package to be mounted to a mounting surface of a printed circuit board. The length is sufficient for movement during temperature excursions thereby relieving movement in joints affixing lead ends to contact pads. The lead first end is dimensioned for attachment to a contact pad of a leadless package and the lead second end is dimensioned for attachment to a contact pad located on the surface of the printed circuit board. In a preferred embodiment of the invention, the second lead end is dimensioned for extending from the package underside to a package side portion. The lead second end forms a bend for cooperating with the printed circuit board pad and solder joint affixing the printed circuit board pad the lead second end. A fillet is formed useful for inspecting the solder joint. Further, in the preferred embodiment the lead has a substantially flat cross-section for presenting a shallow profile when resting between a leadless package and printed circuit board. With such an arrangement, the area of the surface mount package underside that comes into contact with non-brazed portions of the hidden lead is free of any electrical conductive traces typically found on the printed circuit board.

In another embodiment of the invention, a leadless package mounting assembly useful in reducing cross-talk between input and output leads comprises a leadless surface mount package having a plurality of contact pads for communicating with corresponding contact pads of a printed circuit board. The package pads are affixed along an underside portion of the package proximate package sideportions. The package pads have input, output and ground pads wherein the input pads are opposing the output pads. The ground pads are placed therebetween. Further, a plurality of input leads extends generally across the package underside portion. Each input lead has a length sufficient for placing an input lead first end in contact with a corresponding package input pad proximate one side of the package and an input lead second end at an opposing side portion of the package. Each input lead first end is in electrical contact with a corresponding package input pad. A plurality of output leads extends generally across the package underside portion wherein each output lead has a length sufficient for placing an output lead first end in contact with a corresponding package output pad and an output lead second end at an opposing side portion of the package. Each output lead first end is in electrical contact with a corresponding package output pad. Finally, at least one ground lead extends across the package underside portion. Each ground lead has a length sufficient for placing a ground lead first end in contact with the package ground pad and a ground lead second end at an opposing side portion of the package. Each ground lead first end is in electrical contact with each package ground pad. With such an arrangement, placing the ground lead between the input and output leads reduces cross-talk between the input and output leads.

The present invention presents a method for preventing cracking in solder joints used in mounting a leadless chip package to a printed circuit board. The method comprises the steps brazing a lead first end to a package contact pad positioned on an underside of the package along a package side portion. The lead is extended across the package underside by placing a lead second end at an opposing side portion for affixing the lead second end to a printed circuit board pad. Next, the package is positioned for affixing the lead second end to the printed circuit board pad and soldering the lead second end to the printed circuit board pad for mounting the package onto the printed circuit board thereby forming a solder joint wherein movement of the lead during temperature excursions is sufficient for relieving movement of the solder joint and thus preventing cracking within the joint.

The method further includes extending the lead second end and bending the lead second end from the package underside onto a side for exposing the lead second end while the package is affixed to the printed circuit board. A fillet is formed during the soldering step by causing solder to flow between the printed circuit board pad and the lead second end thereby exposing the solder joint for inspection while the package is affixed to the printed circuit board.

In the preferred embodiment of the present invention, the lead first ends are brazed to the package contact pads and the leads are extended across the underside of the package. The package is positioned for affixing the lead second ends to corresponding printed circuit board pads whereby each lead avoids contact with any printed circuit board conductive traces. A layer of an alloy solder paste is placed onto each board pad communicating with a lead second end. The paste has a melting temperature below the melting temperature of the braising material used in the braising step. The assembly is then placed at a temperature environment for melting the paste, soldering the lead second ends and reducing the temperature for solidifying the solder paste thereby mounting the package onto the printed circuit board. In an alternate embodiment of the invention, the lead central portions are covered with an insulating material for preventing electrical contact between the lead central portion and conductive traces or conductive materials located on the printed circuit board surface.

It is a primary object of the invention to provide a method and device that is incorporated into the mounting process of a surface mount package to a printed circuit board whereby stress within the solder joints caused by differing coefficients of thermal expansion between the surface mount packages, solder and printed circuit board components is reduced. It is another object of the invention to provide means for improving crosstalk rejection between the input and output terminals of such leadless components. It is yet another objective of the invention to provide such crosstalk rejection and reduced solder joint stress while at the same time reducing the need for increased board area and packaging heights. The surface mount stress relief hidden lead device disclosed herein meets the objectives by providing a device so configured that the relative movement between a leadless chip carrier such as an SMP and the printed circuit board to which the SMP is affixed occurs along a length of the hidden lead as opposed to permitting excessive tensional or compressional forces to be applied to the solder joints. The device disclosed eliminates the damaging stresses within the solder joint and thereby eliminates the creep in the solder joint that causes ultimate joint failure.

BRIEF DESCRIPTION OF DRAWINGS

A preferred embodiment of the invention as well as alternate embodiments are described by way of example with reference to the accompanying drawings in which:

FIG. 8a is a partial perspective view of a two layer printed circuit board having cavities in a top layer, the cavities exposing solder pads affixed to a bottom layer of the printed circuit board;

FIG. 8b is a partial cross sectional view of an SMP resting on a top surface of a top layer of a printed circuit board wherein high temperature solder balls are positioned for a reflow process; and FIG. 8c is a partial cross sectional view of a completed surface mount stress relief assembly of the SMP pads affixed to pads on the printed circuit board using a solder column.

DETAILED DESCRIPTION OF PREFERRED EMBODIMENT

Figure 1:
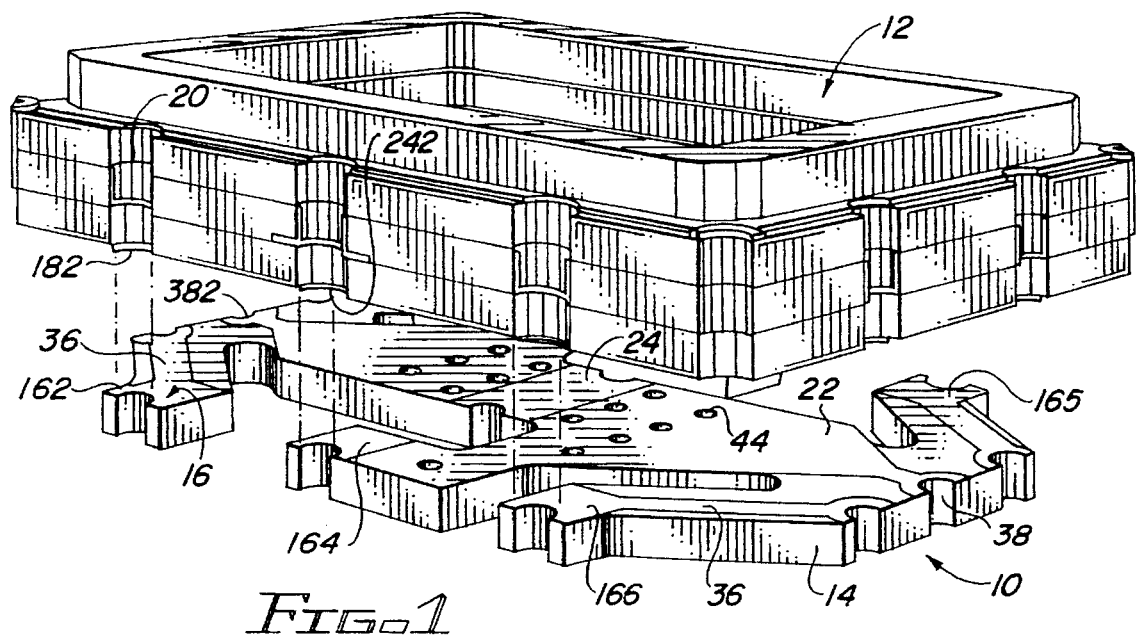
FIG. 1 is a perspective view of a stress relief interface printed circuit board in an exploded arrangement with a perspective view of a surface mount package, the angle of view is such that a first surface for interfacing with a SMP or the like is shown, the package is shown without its leadless component and without its hermetically sealed package top.

A preferred embodiment of the stress relief interface PC board 10 is shown by way of example for use with a surface mount package 12 in FIG. 1. The preferred embodiment of the device 10 comprises a PC board base structure 14 made from FR-4 epoxy and glass laminate. Other relatively compliant PC board materials well known in the art can also be used. The interface board 10 is configured to be placed between a surface mount package 12 and a printed circuit board (not shown).

Figure 2:
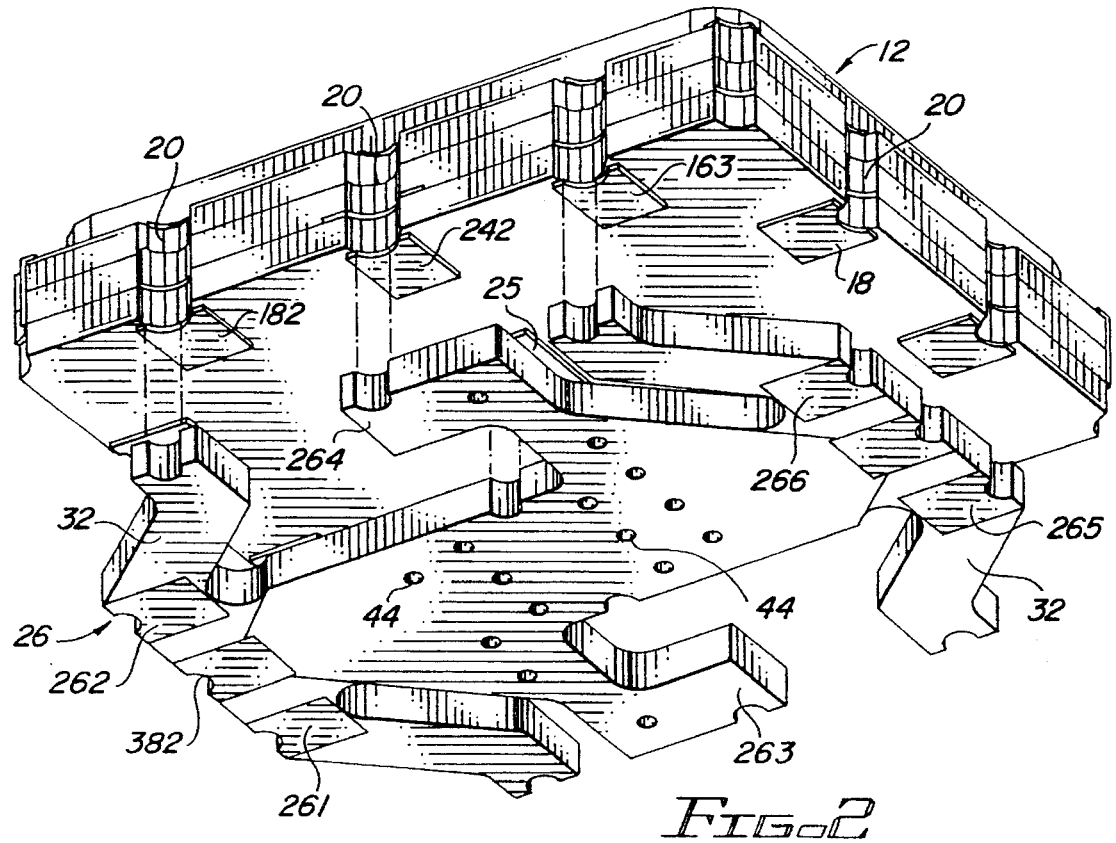
FIG. 2 is a perspective view of the stress relief interface printed circuit board in an exploded arrangement with a perspective view of the surface mount package, the angle of view is such that a second surface for interfacing with a printed circuit board is shown, the base side of the SMP is shown with its multiple solder pads and castellations.

In the preferred embodiment illustrated here by way of example, interface PC board 10 includes electrical contact or solder pads 16 which are sized and positioned to fit the footprint of the SMP solder pads 18. As illustrated in FIG. 2, a perspective view of the stress relief interface printed circuit board 10 in an exploded arrangement is shown with a perspective view of the surface mount package 12. The angle of view is such that the surface of the board 10 for interfacing with a printed circuit board is shown. The base side of the SMP 12 which contacts the board 10 is shown with its multiple solder pads 18 and castellations 20.

Figure 3:
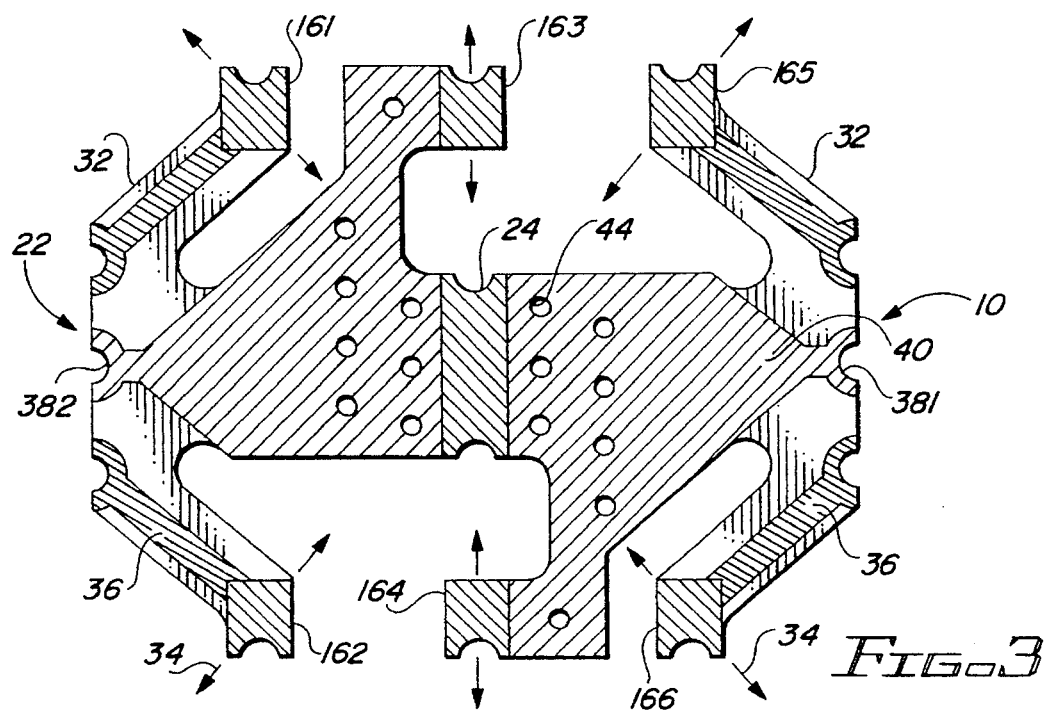
FIG. 3 is a plan view of the preferred embodiment first surface of the interface printed circuit board illustrating the segregation of the solder pads based on input, ground and output signals and the electromagnetic shielding plate configuration between the input and output pads, arrows illustrating the movement of pads due to thermal expansion effects are shown.

The placement of the first set of solder pads 16 on the first surface 22 of the interface board 10 is such that each active SMP pad 18 has a corresponding interface pad 16. In the illustration as presented in FIG. 1, the SMP 12 has ten peripheral pads 18 and a central ground pad 24 which is more clearly illustrated in FIG. 3 illustrating by way of a plan view of the preferred embodiment first surface 22 of the interface printed circuit board 10. FIG. 3 also illustrates the segregation of the solder pads 16 based on input pads 161 and 162, ground pads 24, 163, and 164, and output signal pads 166 and 165. Of the peripheral pads 18 shown in the SMP 12 of FIG. 2, only seven pads are required for the intended SAW device (not shown) but it is expected that those of ordinary skill in the art will see that an interface board 10 can be configured to use the precise amount of required pads 16 or with extra pads so that a variety of components can be used within the SMP 12 without using a special interface board for each component. The active pads 18 of the SMP 12 for the example shown are two output pads 181 and 182, two peripheral ground pads 241 and 242, the center ground pad 24, and two input pads 161 and 162. These pads can best be seen by viewing FIGS. 1 and 3. For each of these active SMP pads 18, there is a corresponding interface pad 16, the two input pads 161 and 162, two peripheral ground pads 163 and 164, two output pads 165 and 166, and a center ground pad 24. These corresponding pads are aligned when the SMP 12 is affixed to the interface board 10 through soldering processes such as reflow well known in the art of leadless component soldering.

In the preferred embodiment, the solder pads on the interface board 10 are solder tinned copper. Typically the SMP 12 solder pads are fabricated from a gold plated refractory metal. The interface printed circuit board as discussed earlier is constructed from FR-4 epoxy and glass laminate having a characteristic coefficient of thermal expansion ranging from 16 to 24 ppm/C. These preferred embodiment materials were selected for use with a surface mount package 12 constructed from an alumina having a characteristic coefficient of thermal expansion of approximately 3 to 5 ppm/C. The printed circuit board not shown but used in the thermal testing for the interface device 10 and in the completed product device is also made from an FR-4 laminate.

Figure 5:
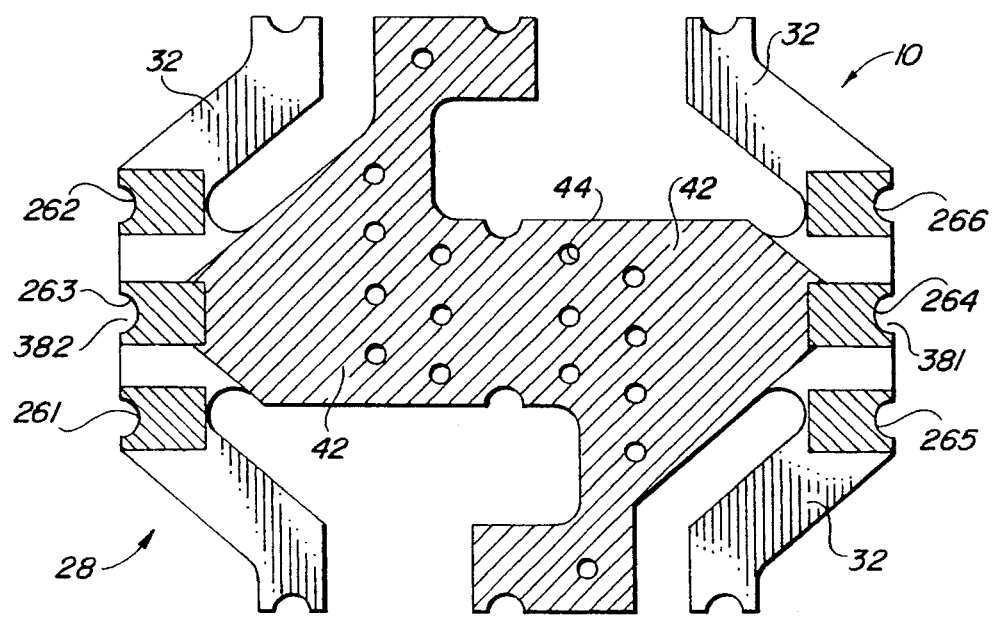
FIG. 5 is a plan view of the preferred embodiment second surface of the interface board illustrating the arrangement of the pads and ground shield for the PC board interfacing side.

With reference again to FIG. 2, a second set of pads 26 is affixed to the second surface 28 of the interface board 10. There is a corresponding pad 26 for each of the first surface pads 16. By way of example with the embodiment using the illustrated SAW device configuration, and as illustrated in FIGS. 1 and 2, interface input pads 161 and 162 will have a corresponding second surface input pads 261 and 212. Similarly for peripheral ground pads 163 and 164, there are corresponding peripheral second surface ground pads 263 and 264, and likewise second surface output pads 265 and 266 to correspond to first surface input pads 165 and 166. Unlike the aligned relationship between the peripheral SMP pads 18 and the first surface pads 16, the second surface pads 26 are laterally displaced from their corresponding first surface pads 16 as can be seen when comparing the illustrations of the top view and bottom view of the board 10 as illustrated in FIGS. 3 and 5. FIG. 5 shows a plan view of the preferred embodiment second surface 28 of the interface board 10 illustrating the arrangement of the pads for interfacing with a PC board (not shown). The interface board pads 16 as illustrated are located on the perimeter of the interface board 10 in such a manner that each is located at the extremity of an arm member 32, the arm member 32 formed by the removal of board material 14 along a path on the arm member 32 between the peripheral pad 16 and its cooperating second surface pad 26. It is this displacement between cooperating pads and the increased flexibility of the board structure 14 by virtue of the peninsular shaped arm member 32 that allows the epoxy and glass laminate to flex from thermal expansion forces as a result of the differing coefficients of thermal expansion. By way of further example with the demonstrated embodiment, and again with reference to FIG. 3, a concept of the invention is illustrated with a polar array or arrows 34 indicating the direction of movement of the perimeter pads 16 caused by the expansion of the material as a function of temperature increases and decreases. The movement 34 radially in and out is relative to a stationary point in the center of the central ground pad 24. The central ground pad 24 is affixed to a central pad 25 of the SMP 12. Keeping in mind that if the coefficient of thermal expansion for the "x", "y" and "z" components of a material are equal, the change in size due to temperature effects is constant throughout the molecular structure. Therefore if the centroid of a piece of material is understood to be stationary, the size change relative to the centroid will be uniform throughout the material and will be either away from or toward the centroid depending on whether the temperature is increasing or decreasing and whether the material has a positive or negative coefficient of thermal expansion. The forces required to displace the perimeter pads 16 located at the ends of peninsular arm members 32 has been measured and been found to be orders of magnitude less than the force required to cause any degradation to a solder joint. This is where the movement occurs rather than in the solder joint as is the typical case where the joint undergoes the stress and resulting creep. Because the laminate flexes, the integrity of the solder joint is maintained as the components are sent through their cyclical thermal gradients.

Figure 4:
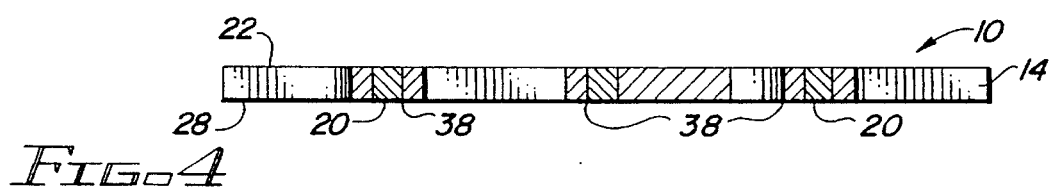
FIG. 4 is a side view of the embodiment of FIG. 3 illustrating the vertical castellations which provide a contact between the first surface and second surface of the interface board.

Again with reference to FIG. 3, each of the six pads (161 through 166) located on the perimeter of the interface PC board 10 are located at the end of a peninsular arm member 32. A circuit board conductive trace 36 connects each of these pads 16 to a semicircular vertical trace referred to as a castellation 381 and 382 that then connects to the cooperating solder pads 26 located on the second surface 28 of the interface board 10 as is illustrated in the side view of the board 10 in FIG. 4 and in the perspective views of FIG. 1 and FIG. 2. The solder pads 26 are used for the solder connection to the printed circuit board used for the electronic product being assembled. These castellations 38 form a 180 or half cylinder shaped conductive paths (illustrated in the views of FIG. 3 and FIG. 4) that are located on the outer edge of the interface PC board 10. These castellations 38 make the electrical connection between the first surface traces 36 and second surface pads 26 as described and in addition, once brought together for assembly, allow solder to wick up into the castellation 38 from the pad 26 during reflow and ease the task of visual inspection of a solder joint after reflow. Standard conductive feed throughs are also used for the purposes of making the electrical connection between surfaces of the interface board 10.

To re-emphasize for the case of the interface printed circuit board 10, the expansion will be radially outward from the center area of the board where the center ground pad 24 is affixed. It can be seen therefore that these radial forces will move the first surface peripheral pads 16 so as to create a flexing or compliant moment arm with their corresponding second surface pads 26. This compliant arm member 32 between each of the first and second surface pad pairs provides the stress relief to the solder joints by taking the movement over the moment arm rather than all within a solder joint of the known solder column. The arrows 34 shown in FIG. 3 illustrate this stress relief movement path of the compliant arm member. The ideal interface board 10 will have moment arms 32 that are displaced radially outward from the center of the board 10. As surface mount packaging evolves to meet extreme thermal cycles, it is anticipated that such SMP packages will focus on such expansion phenomenon and ideal interface designs will also evolve. In the meantime, when the demands on packaging come primarily from those leadless devices now in the marketplace, the preferred embodiment has been proven to be the best mode for the invention as disclosed.

Figure 6A:
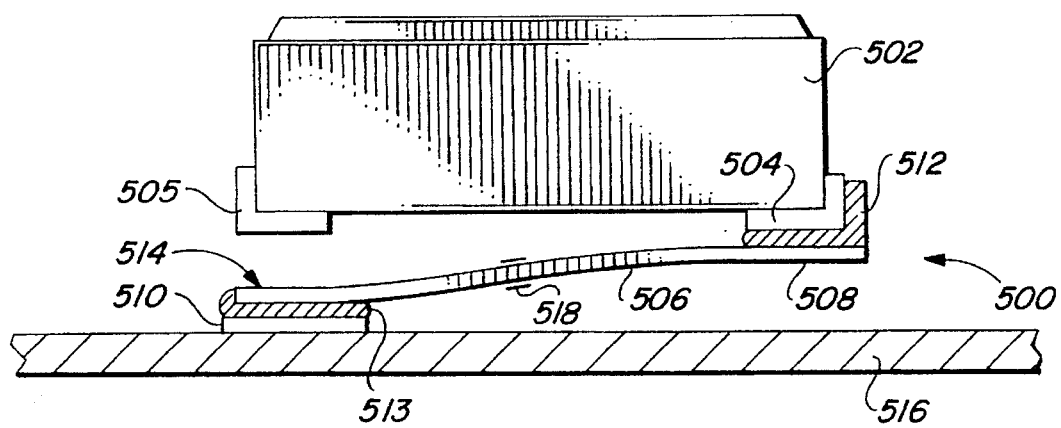
FIG. 6a is a partial side view of a surface mount package illustrating use of a hidden lead package device affixing pads of the surface mount package to cooperating pads on a printed circuit board.
Figure 7:
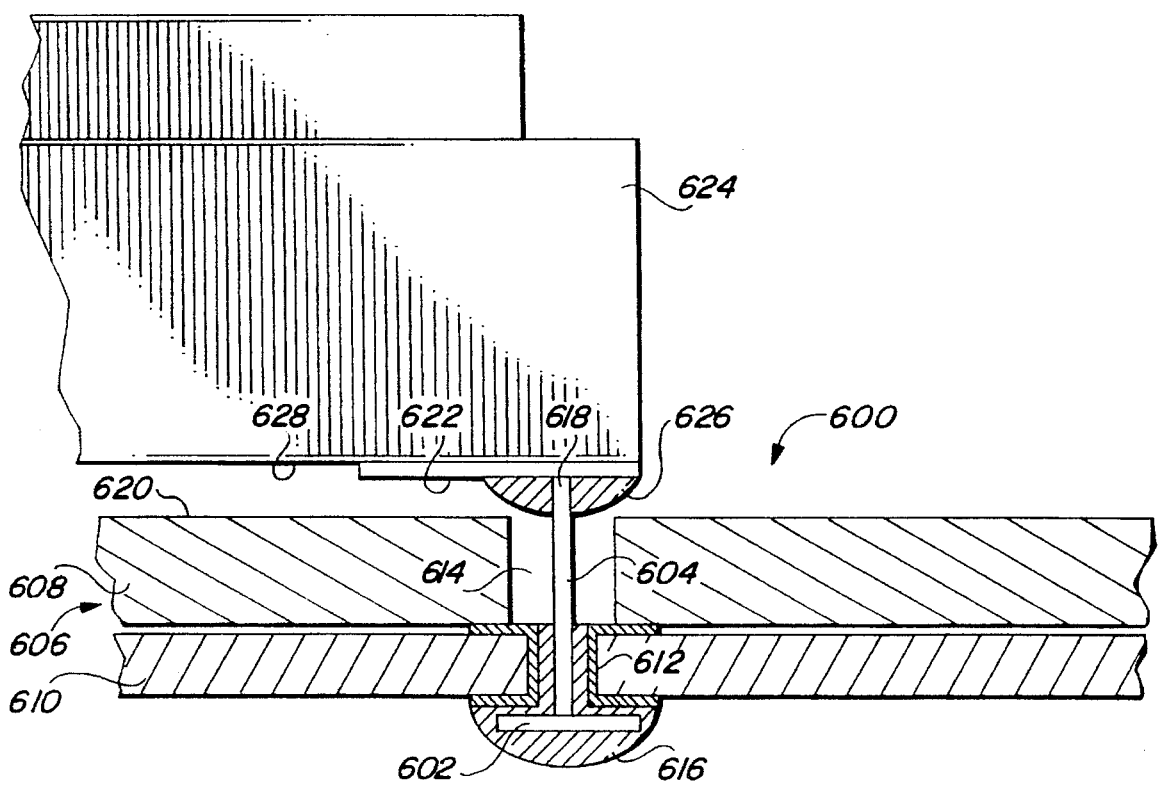
FIG. 7 is a partial cross sectional view of a surface mount stress relief inverted nail head pin penetrating a metallic feed through in a bottom layer of a printed circuit board, a pin post extending through a non-metallic feed through in a top layer of the printed circuit board and affixed using solder to an SMP pad.

At this point in the detailed description, it is of interest to present alternate methods and devices used in solving the stress relief problems associated with leadless devices. These devices are illustrated in FIGS. 6, 7 and 8.

As illustrated with reference to FIG. 6a, a surface mount stress relief hidden lead package device 500 comprises an SMP 502 having SMP pads 504 and 505 where, by way of example, pad 504 is affixed to a flat hidden metal lead 506 at the lead end 508. A plurality of leads are attached to the SMP pads by a high temperature solder 512 or a brazing technique that will not be affected by the temperature profile required to reflow lead tin paste when attaching the lead 506 to a PCB pad 510. In the preferred embodiment, lead end 514 is affixed to the printed circuit board pad 510 using a tin solder 513 well known in the art. A cross-sectional view in a plane passing through pads 504 and 510 is illustrated with reference to FIG. 6b. Such a view illustrates the offset between pads of the surface mount package (for example 504 and 505) permitting the surface mount package 502 to rest in close proximity to the printed circuit board 516 without a lead 506 making electrical contact with other than its intended contact points of pads 504 and 510 as illustrated with reference to FIG. 6c. It is of value to note that typical hidden lead thicknesses 518 are of the order of 0.003 inches and once affixed between the PC board pad 510 and the SMP pad 504 allows the SMP 502 to be separated from the PC board 516 by distances 520 in the order of 0.005 inches as illustrated with reference to FIG. 6c. Such a hidden lead device 500 in the method of affixing the device 500 between the SMP 502 and PC board 516 solves problems related to the coefficient of thermal expansion mismatch between the SMP 502 and PCB 516 and in addition provides a minimum mounting height 522 or distance 520 of the SMP 502 to the board 516. Reducing the mounting height 522 saves valuable space in the configurations typical for electronics using SMP technology. In addition, the hidden lead 506 easily flexes to relieve joint stress during temperature excursions.

Figure 6B:
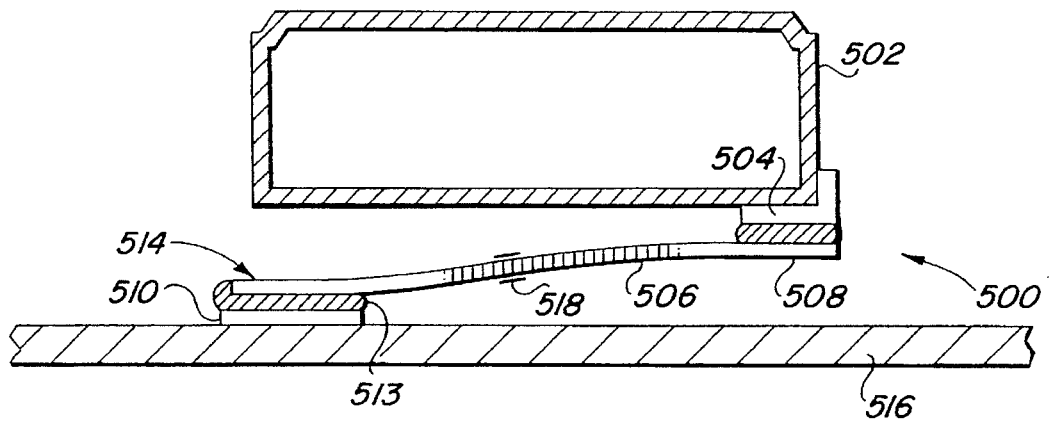
FIG. 6b is a partial cross-sectional view of the embodiment of FIG. 6a in a plane passing through the lead and pads.
Figure 6C:
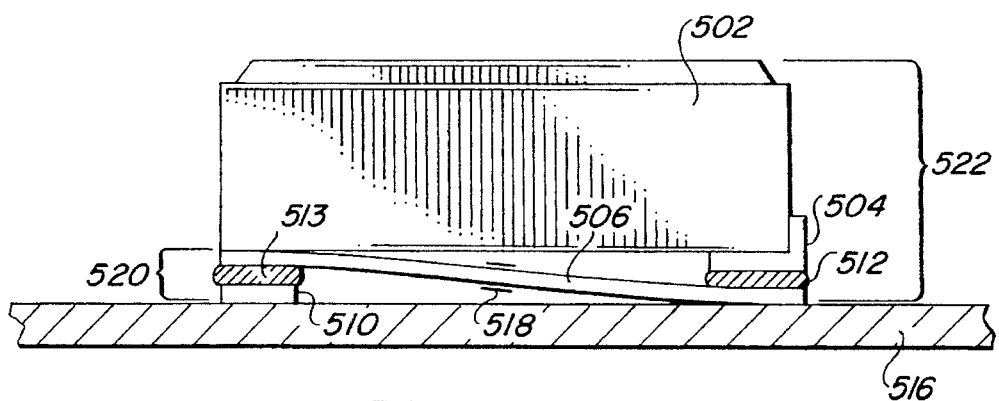
FIG. 6c is a partial side view of the surface mount package of FIG. 6a illustrating the package mounted in a preferred embodiment proximate the printed circuit board.
Figure 6D:
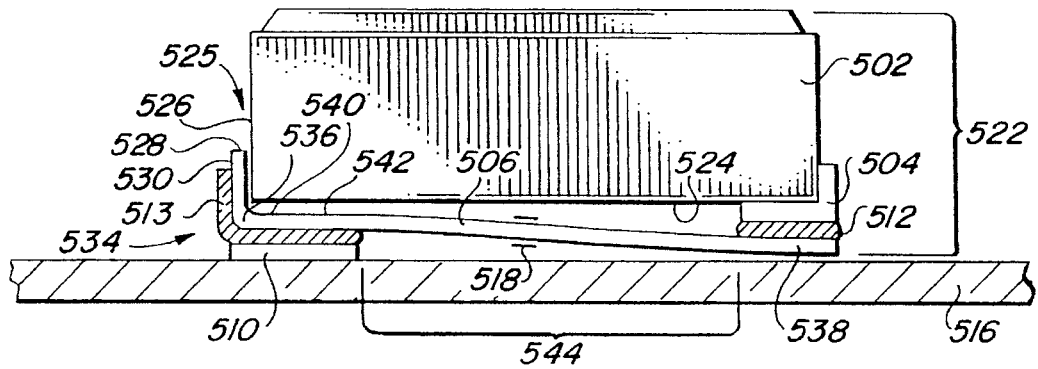
FIG. 6d is a partial side view of a preferred embodiment of the hidden lead package illustrating a solder joint having a lead end extending upward along a side of the surface mount package.

To further illustrate the present invention, a preferred embodiment of the hidden lead package device 500, in a package assembly is made up of two basic components, the package 502 and the hidden leads 506. With reference to FIG. 6d, and by way of example, a package body is illustrated as the leadless surface mount package 502 with electrical attachment pads 504 located on the underside 524 of the package 502 as earlier described. The underside 524 is the side that would normally face the printed circuit board 516. As described, the hidden leads 506 are flat metal leads that attach to the pads 504 on the underside 524 of the package 502. The lead 506 extends across the underside 524 to an opposite side 525 from which the lead 506 is attached to the SMP pad 504 and then bends upward at a 90° angle along the package side 526 terminating along the side 526. The termination location 528 or the end of the vertical portion of the lead 530 is not critical except for the need to have sufficient height and surface area for the lead end 530 extending along the side 526 so that the solder 513 from the solder joint 534 that attaches the hidden lead 506 to the PC Board pad 510 can wick up onto the vertical portion 530 and create a fillet from the printed circuit board pad 510 to the hidden lead vertical portion 530 in order to aid in the quality inspection of the final solder joint 534. This solder joint 534 will have the appearance of a typical solder fillet from a printed circuit board pad 534 into a surface mount package plated castellation.

The hidden lead 506 is attached to the SMP 502 before the package 502 is placed and soldered to the PCB 516. Hidden leads are brazed or affixed to the pads on the package with a braze that has a liquid temperature that is higher than any of the processing temperatures that the package will encounter from that point forward. The flat hidden lead 506 is generally straight except for the approximate 90° bend 536 that is at the opposite end of the lead from the braze to package location 538. The area 540 of the surface mount package underside 524 that comes into contact with the non-brazed portion 542 of the hidden flat metal lead 506 is free of any electrical conductive traces.

As discussed earlier the use of the hidden lead package device 500 provides for good cross talk suppression when the lead 506 is used between a ground pad of the SMP 502 and corresponding PCB ground pads 510. By way of example and as illustrated with reference to FIGS. 6e, 6f and 6g, five hidden leads (506a through 506e) are attached to pads on the SMP 502. They are input 506a and 506b, output 506d and 506e and ground 506cleads. The ground lead 506c is located between the input 506a and 506b and output 506d and 506e lead pairs. Such an arrangement has been determined to be an efficient way of decreasing cross talk between the input 506a and 506b and output 506d and 506e leads.

The hidden lead package 502 is mounted to a printed circuit board by following standard surface mount placement and attachment procedures. In the present invention, a printed circuit board 516 is designed so that there is a corresponding solder pad for each of the hidden lead solder locations. The printed circuit board is also designed so that there are no unwanted conductive traces (not shown) in an arrangement that would allow them to come into contact with any of the hidden leads. A layer of solder paste of an appropriate alloy as earlier described is placed onto all of the solder pads of the printed circuit board that will come into contact with a hidden lead solder area. The hidden lead device 500 is placed onto the printed circuit board accurately so that the hidden lead solder areas are all in contact with the solder paste that was precisely placed on each of the solder pads of the printed circuit board. This assembly is exposed to an appropriate time temperature profile that is typically encountered in a solder reflow oven and the solder is raised to a temperature that causes it to melt and then allow to cool at a predetermined rate. As the solder temperature decreases the solder solidifies as the temperature passes below the liquid temperature of the alloy and the solder thus adheres to the hidden leads and the printed circuit board pads. Attachment is thus completed.

The hidden leads 506 are substantially horizontal members that contact the package pads 504 on one end (braze) joint 512 to the PC Board pad 510 on the other end (where the lead bends upward at a 90° angle) as earlier described with reference to FIG. 6d. Also as earlier described, the coefficient of thermal expansion of the surface mount package material, the hidden lead material and the printed circuit board material are typically all of differing values. They each expand a different amount for a given change in temperature. This mismatch of expansion from temperature change causes displacement in the connection mechanism that attaches packages to printed circuit boards. In the present invention, the connection mechanism is the hidden lead 506 of the hidden lead package device 500. The displacement that results from the expansion causes mechanical stress to occur primarily in the hidden lead. The braze joint 512, the solder joint 534, the surface mount package 502 and the printed circuit board are therefore the recipients of stress relief and thus a primary object in the invention is accomplished.

As earlier described, when no such stress relief device as the hidden lead package device 500 is used, the solder joint attaches the surface mount package solder pad directly to the printed circuit board solder pad. During thermal excursions the expansion mismatch that occurs between the printed circuit and the surface mount package will cause the stress level in the solder joint to exceed acceptable "creep" levels within the solder alloy. As the solder Joint experiences "creep, " a crack will begin to form that will cause a complete separation between the surface mount package pad and the printed circuit board pad after some number of thermal excursions.

When the hidden lead 506 is present between the surface mount package pad and the printed circuit board pad, a majority of the displacement due to mismatch occurs within the central region 544 as earlier described of the hidden lead 506 between the brazed area 538 at the surface mount package pad 504 and the soldered area 530 at the printed circuit board pad 510. The characteristics of the material chosen for the hidden lead 506 are such that the stress required to cause displacement within the hidden lead 506 is significantly less than the stress that would cause a failure in any of the other materials that are attached to the hidden lead. It should also be noted that this stress level within the hidden lead 506 is also within the normal operating range for stress within the hidden lead 506 itself so there is no mechanical failure in the hidden lead device assembly 500 regardless of the number of thermal excursions. In an alternate embodiment of the hidden lead package device 500, the lead central portion is covered with a non-conductive coating.

The configuration of the hidden lead package device 500 allows the surface mount package 502 to be spaced above the printed circuit board 516 at an elevation that is similar or the same as the elevations found in standard solder joint surface mount assemblies. This feature is not common in other leaded devices which typically require more vertical space. The hidden lead package device 500 allows for extremely low geometric profiles of surface mount devices without the solder joint failure problem that is related to the thermal mismatch of the package 502 and printed circuit board 516 materials.

Figure 6E:
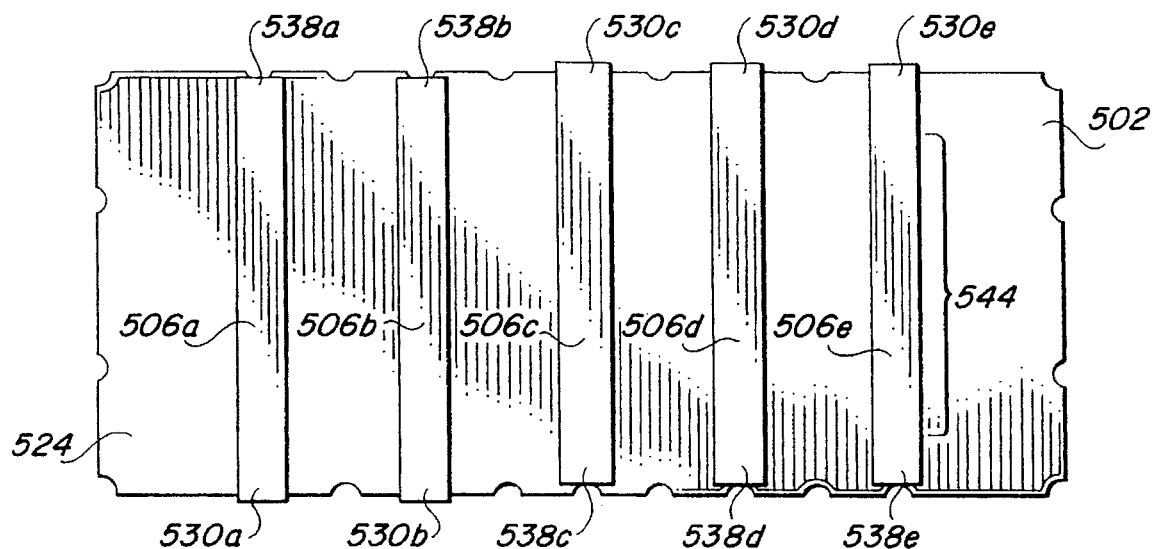
FIG. 6e is a bottom plan view of a package underside illustrating an alternate lead configuration for minimizing cross-talk between input and output pads.
Figure 6F:
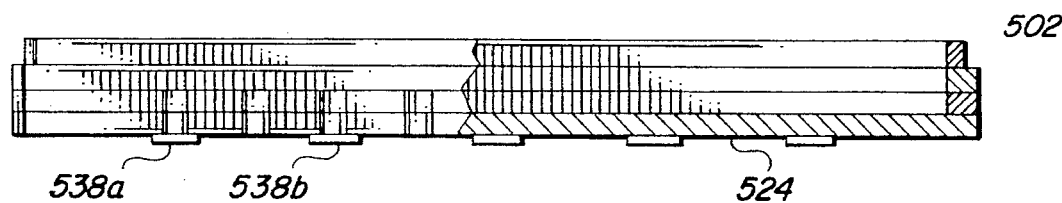
FIG. 6f is a front elevational view of the surface mount package of FIG. 6e.
Figure 6G:
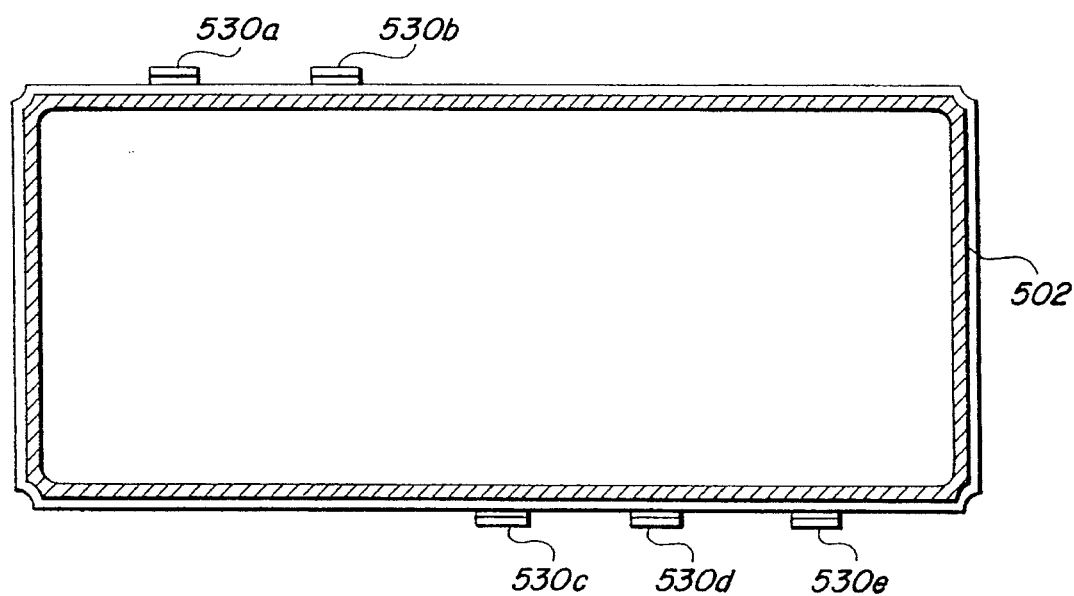
FIG. 6g is a top plan view of the package of FIG. 6e.

It should be noted that the ground hidden lead 506c described with reference to FIGS. 6e through 6g is in the center of the underside 524 of the surface mount package 502 between the input 506a and the 506b and output 506d and 506e lead pairs and acts as an RF shield to decrease cross talk between input and output signals. The fact that the lead is sandwiched between the package 502 and the printed circuit board 516 causes it to become very efficient in its RF shielding. This is a feature that standard non-hidden lead mounting configurations do not have. Therefore, there is an RF performance advantage to the hidden lead device 500 in addition to the thermal mechanical advantage.

It should also be noted that the hidden lead package device 500 can be completely assembled by a package manufacturer such that no special processing is required when attaching the package to a printed circuit board. The hidden lead package device 500 can be handled in all parts of the required processes in the same fashion as the standard non-hidden lead package. It should also be noted that after reflow, the mounted hidden lead package device 500 appears the same as the non-hidden lead package and can meet all mounting envelope dimensional requirements of the industry.

Another method for resolving the coefficient of thermal expansion mismatch is seen in the inverted nail head stress relief pin illustrated in FIG. 7. The inverted nail head pin 600 comprises a head 602 to which a pin post 604 is integrally affixed. The inverted nail head pin 600 is used in combination with a printed circuit board 606 having a top layer 608 and a bottom layer 610. A PC board bottom layer 610 has a metallic feed through 612 for receiving the pin post 604. The PC board top layer 608 has a non-metallic feed through 614 cooperating with the metallic feed through 612 to receive the pin post 604. The head 602 and a portion of the pin post 604 passing through the metallic feature 612 is affixed to the metallic feed through by use of high temperature solder 616. The pin post 604 is of such a length that the pin top 618 extends above the PC board top layer top surface 620 in order to receive an SMP pad 622. An SMP 624 having the SMP pad 622 is affixed to the pin top 618 using a tin solder 626. By mounting the SMP 624 in this manner, a distance between the SMP bottom surface 628 and the PC board top layer surface 620 is typically of the order of 0.005 inches in the preferred configuration. The inverted nail head pin 600 thus provides a means of solving the coefficient of thermal expansion mismatch without the use of a specially designed package or SMP 624. The PC board 606 used would be constructed of the two layers 608 and 610 as described wherein the bottom layer 610 has metalized feed throughs and a top layer 608 has corresponding holes without metal 614. The pin 600 is inserted into the metallic feed through 612 and allowed to extend through non-metallic hole 614 to a point that would be about 0.005 inches above the top surface 620. The head of the pin 602 is then soldered with a high temperature solder 616 so that the joint between the head and the metallic feature 612 remain solid during a subsequent reflow of standard low temperature lead tin solder 626. Lead tin solder 626 would be screened on to the SMP 624 solder pads 622. The package 624 is placed on to the exposed pin tops and sent to a reflow oven to reflow the lead tin solder 626 not affecting the high temperature solder 616. In this way, the SMP 624 is attached to the PC board 606. Movement caused by coefficient of thermal expansion mismatch is absorbed by the exposed portion of the pin post 604 that passes through the nonmetallic feed through 614 in the PC board top layer 608.

As illustrated in FIGS. 8a, b and c, a slotted PC board 700 is used to manage the coefficient of thermal expansion mismatch that occurs when a leadless ceramic chip carrier and a PC board have differing coefficients of thermal expansion. As illustrated in FIG. 8a, a two layer PC board having a top layer 702 and a bottom layer 704 are affixed. The top layer 702 has cavities 706 configured such that portions of the top surface 708 of the top layer 702 are exposed. Solder pads 710 are arranged on the top surface 708 of the bottom layer for receiving SMP pads 712 of an SMP 714. The SMP 714 is placed on the portion of the top layer between a pair of cavities 706. Such a portion 716 permits the SMP 714 to rest on a top surface 718 of the top layer 702 directly. The SMP pads 712 are suspended over the cavities 706 and above corresponding PC board solder pads 710. The PC board solder pads 710 have a border around the perimeter of the solder pads to allow room for a finished solder column to move unrestrained. The opening of the cavity 706 is such to enhance cleaning. As illustrated in FIG. 8b, an SMP 714 placed in a position such that the SMP pad 712 is above an appropriate PC board solder pad 710. A low temperature solder paste 720 is screened on to the SMP pads 712 first. Then a high temperature solder ball 722 is placed on each pad 712 into the paste 720. The SMP 714 then passes through a reflow oven that reflows the low temperature solder 724 but does not reflow the high temperature solder ball 722. This process attaches the high temperature solder ball 722 to the SMP pad 712 and completes the package preparation. In the preparation of the PC board 700, standard solder paste 726 normally a lead tin material is applied to the PC board solder pads 710 located within the cavities 706 on the top surface 708 of the PC bottom layer 704. The SMP 714 with the solder ball 722 now attached is placed on the PC board such that the solder ball 722 are inserted into the solder paste 726 located on the PC board pad 710. Such an assembly is now ready for reflow. Once passing through the reflow process, the completed assembly is as illustrated in FIG. 8c. The center portion of the SMP 714 lower surface 728 rests on the top surface portion 716 between the cavities 706. Solder columns 730 which are now a new alloy containing each of the three original alloys are significantly taller than standard solder joints and give the effect of a lead. Such a column will bend to relieve the stress that is caused by the coefficient of thermal expansion mismatch between the SMP 714 and the printed circuit board 700. As discussed earlier a standard height solder joint would be in shear and cause creep to occur in the solder alloy. This creep will eventually cause the solder joint to break. The solder column 730 eliminates such a problem. This situation where the SMP sits on the upper PCB surface is the most favorable at controlling cross talk since there is minimal gap between the SMP and the PC board.

Again with reference to FIG. 3 showing a top view of the interface board 10, it can be seen that the preferred embodiment has segregated its pads 16 such that the ground pads divide the input and output pads. In the preferred embodiment, the ground pads are contained within a shield plate 40. This metallic shield plate 40 as illustrated in FIG. 3 acts as an electromagnetic wave barrier between the input pads 161 and 162 and the output pads 165 and 166 located on the opposite side of the shield plate 40. FIG. 5 illustrates the shield plate 42 configuration on the second surface 28. As illustrated, the input pads 261 and 262 are segregated and separated from the output pads 265 and 266 by the shield 42. The ground pads 263 and 264 are connected to the shield 42. Again with reference to the perspective views of FIGS. 1 and 2, it can be appreciated how the shields 40 and 42 are configured on the surfaces 22 and 28 of the interface board 10. Ground pad castellations 381 and 382 provide the electrical connection between the shields 40 and 42. In addition, as is illustrated in the above referenced drawings, the preferred embodiment comprises ground shield feed throughs 44 that provide electrical connection between the shields. Such a shield configuration has proven to effectively reduce cross-talk between the input and output signals. Tests measuring signal interference effects have shown that the interface board comprising the electrical shield plate configuration as described provided improved crosstalk rejection when compared to surface mount packages 12 mounted without the stress relief interface PC board 10. For the specific devices tested, crosstalk rejection improved by about 49 dB to 52 dB amounting to approximately six per cent (6%). It should be appreciated that this is a significant improvement when one considers that component parts would be rejected as failed when showing only a ½ dB crosstalk effect.

The embodiments presented are used with SAW devices and are shown for illustrative purposes only. It is appreciated that various leadless chip carriers and leadless devices can benefit from the invention disclosed and variations in specific configurations are anticipated. Tests have shown that the above described interface device 10 successfully prevents failure of the solder joints in leadless component configurations. By way of specific example, a test sample of surface mount packages were affixed directly to printed circuit boards and passed through a thermal cycle ranging from −30 C. to +70 C. All packages showed some joint failure. A similar test sample using the interface device be was passed through the same thermal cycle without any failures. As of this writing, surface mount packages affixed to printed circuit boards using the interface board be have been run through thermal cycles ranging from −55 C. to +125 C. with no measurable failures. The tests included the use of vaporized liquid nitrogen baths to bring test fixtures containing the SMP, interface board 10 and the printed circuit board to −55 C. The fixture was allowed to soak at that temperature for approximately one half hour. After the low temperature soak, the temperature was raised to approximately +125 C. over a period of about five minutes. The fixture was allowed to soak at this high temperature for approximately one half hour at which time the thermal cycle was repeated. The boards be were dynamically tested in this way and solder joints continuously monitored for electrical continuity for approximately five hundred thermal cycles. These test showed the interface boards to be a success.

As discussed, the embodiments illustrated have used surface mount packages (SMP) found more often in use with SAW devices and their forms described in detail to properly teach the invention. It will be readily apparent to those skilled in the art that various modifications may be made therein without departing from the spirit of the invention or from the scope of the following appended claims.

What is claimed is:

1. A method for mounting a surface mount package onto a printed circuit board, the method useful in preventing cracking of solder joints used in mounting the package, the method comprising the steps of:

brazing a lead first end to a package contact pad, the contact pad positioned on an underside of the package along a package side portion;

extending the lead across the package underside by placing a lead second end at an opposing side portion for affixing the lead second end to a printed circuit board pad;

positioning the package for affixing the lead second end to a printed circuit board pad; and soldering the lead second end to the printed circuit board pad for mounting the package onto the printed circuit board, thereby forming a solder joint wherein movement of the lead during temperature excursions is sufficient for relieving movement of the solder joint thereby preventing cracking within the joint.

2. The method as recited in claim 1, further comprising the steps of:

extending the lead second end;

bending the lead second end from a plane of the underside onto a plane of the side for exposing the lead second end while the package is affixed to the printed circuit board;

forming a fillet during the soldering step by causing solder to flow between the printed circuit board pad and the lead second end thereby exposing the solder joint for inspection while the package is affixed to the printed circuit board.

3. The method as recited in claim 1, further comprising the step of insulating a central portion of the lead, the lead central portion substantially extending between the lead first and second ends.

4. The method as recited in claim 1, wherein the package positioning step further comprises the step of placing the package for preventing contact between the lead and electrically conductive traces formed on a mounting surface of the printed circuit board.

5. The method as recited in claim 1, further comprising the steps of:

extending a set of input leads across the underside of the package for brazing each input lead first end to a package input contact pad;

extending a set of output leads across the underside of the package for brazing each output lead first end to a package output contact pad, the input and output pad set separated by at least one ground pad; and extending at least one ground lead across the underside of the package thereby separating the input and output leads for reducing cross-talk between the input and output pads.

6. A method for mounting a leadless package onto a printed circuit board, the method comprising the steps of:

brazing lead first ends to package contact pads, the contact pads positioned on an underside of the package proximate a package side portion;

extending the leads across the package underside by placing lead second ends at an opposing side portion for affixing the lead second ends to corresponding printed circuit pads;

positioning the package for affixing the lead second ends to corresponding printed circuit board pads whereby each lead avoids contact with any printed circuit board conductive traces;

placing a layer of an alloy solder paste onto each board pad communicating with a lead second end, the paste having a melting temperature below a melting temperature of brazing material used in the brazing step;

placing the assembly in a temperature environment for melting the paste;

soldering the lead second ends to the corresponding printed circuit board pads; and reducing the temperature for solidifying the solder paste thereby mounting the package onto the printed circuit board.

7. The method as recited in claim 6, further comprising the steps of:

extending the lead second ends;

bending the lead second ends at a generally ninety degree angle from a horizontal plane of the underside onto a vertical plane of the side for exposing the lead second ends while the package is affixed to the printed circuit board;

forming a fillet during the soldering steps by causing solder to flow between each printed circuit board pad and lead second end thereby exposing the solder joint for inspection while the package is affixed to the printed circuit board.

8. The method as recited in claim 6, further comprising the steps of:

providing a package having input pads on a package underside proximate a side of the package and output pads along the underside proximate an opposing package side, further the input and output pads are separated by a ground pad;

extending a set of input leads across the underside of the package for brazing each input lead first end to each package input contact pad;

extending a set of output leads across the underside of the package for brazing each output lead first end to each package output contact pad; and extending a ground lead across the underside of the package thereby separating the input and output leads for reducing cross-talk between the input and output pads.

9. A method for mounting a surface mount package onto a printed circuit board, the method comprising the steps of:

connecting an electrically conductive lead first end to a package solder pad on a first bottom side of a surface mount package;

extending the lead across a bottom side portion of the package for placing a lead second end proximate a package second bottom side, the package second bottom side opposing the first bottom side; and connecting the lead second end to a printed circuit board solder pad.

10. The method as recited in claim 9, wherein the first lead connecting step comprises the step of brazing the lead first end to the package pad.

11. The method as recited in claim 9, wherein the second lead connecting step comprises the step of soldering the lead second end to the printed circuit board pad.

12. The method as recited in claim 9, further comprising the steps of:

extending a portion of the lead second end from the second bottom side generally upward along a package vertical side wall;

soldering the lead second end to the printed circuit board pad; and forming a solder fillet extending from the printed circuit board pad upward along the extended lead end vertical portion.

13. The method as recited in claim 9, further comprising the step of electrically insulating the lead along a lead central portion between the first and second ends.

14. The method as recited in claim 9, wherein the lead first end connecting step comprises the steps of:

connecting an input lead first end to a package input pad;

connecting an output lead first end to a package output pad;

connecting a ground lead first end to a package ground pad; and extending the leads across a bottom portion of the package, wherein the ground lead is positioned between the input and output lead for providing an RF shield, thus suppressing cross talk therebetween.

15. The method as recited in claim 9, further comprising the step of:

placing the package bottom side onto a lead top side; and placing a lead bottom side onto the printed circuit board for reducing a height of a package top surface above the printed circuit board.

16. The method as recited in claim 9, wherein the lead comprises substantially flat top and opposing bottom sides.

17. A method for mounting a surface mount package onto a printed circuit board, the method comprising the steps of:

brazing an electrically conductive lead first end to a package solder pad on a first bottom side of a surface mount package;

extending the lead proximate a bottom side portion of the package for placing a lead second end proximate a package second bottom side, the package second bottom side opposing the first bottom side;

placing a layer of solder paste onto a printed circuit board pad;

placing the package onto a surface of a printed circuit board for positioning the lead second end into contact with the solder paste;

positioning the lead second end onto the solder paste for soldering the lead second end to the printed circuit board pad;

exposing the printed circuit board having the package thereon to a temperature sufficient for melting the solder paste and causing the paste to flow between the board pad and lead second end;

cooling the printed circuit board for causing the solder paste to solidify, thus attaching the lead second end to the printed circuit board pad;

connecting the lead second end to a printed circuit board solder pad.

18. The method as recited in claim 17, further comprising the step of extending a portion of the lead second end generally upward along a package side wall portion for forming a solder fillet extending from the printed circuit board pad upward along the extended lead end vertical portion during the solder paste.

19. The method as recited in claim 17, further comprising the step of electrically insulating the lead along a lead central portion between the first and second ends.

20. The method as recited in claim 9, wherein the lead comprises substantially flat top and opposing bottom sides.

* * * * *